(12) United States Patent
Hung et al.

(10) Patent No.: US 11,081,405 B2
(45) Date of Patent: Aug. 3, 2021

(54) METHOD FOR MEASUREMENT OF SEMICONDUCTOR DEVICE FABRICATION TOOL IMPLEMENT

(71) Applicant: Taiwan Semiconductor Manufacturing Co., Ltd., Hsinchu (TW)

(72) Inventors: Shih-Wei Hung, Kaohsiung (TW); Charng-Long Lu, Yunlin County (TW); Chien-Feng Lin, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 27 days.

(21) Appl. No.: 16/396,592

(22) Filed: Apr. 26, 2019

(65) Prior Publication Data

US 2019/0252271 A1    Aug. 15, 2019

Related U.S. Application Data

(62) Division of application No. 15/224,191, filed on Jul. 29, 2016, now Pat. No. 10,276,455.

(51) Int. Cl.
*H01L 21/66*    (2006.01)

(52) U.S. Cl.
CPC .............. *H01L 22/12* (2013.01); *H01L 22/20* (2013.01)

(58) Field of Classification Search
CPC ......... H01L 22/12; H01L 22/20; H01L 21/20; H01L 21/687; H01L 21/66; H01L 21/67201; H01L 21/67748; H01L 21/6831; H01L 21/67115; H01L 21/6838; H01L 21/68742; G01N 21/9501; H01J 37/32743

See application file for complete search history.

(56) References Cited

U.S. PATENT DOCUMENTS

| | | | |
|---|---|---|---|
| 5,809,211 | A | 9/1998 | Anderson et al. |
| 6,022,809 | A | 2/2000 | Fan |
| 7,528,439 | B2 | 5/2009 | Tang et al. |
| 8,323,413 | B2 * | 12/2012 | Son .................... C23C 16/4581 118/730 |
| 8,846,501 | B2 | 9/2014 | Strauch |
| 9,759,656 | B2 | 9/2017 | Ito et al. |
| 2003/0045098 | A1 | 3/2003 | Verhaverbeke et al. |
| 2006/0219172 | A1 | 10/2006 | Kuo et al. |
| 2006/0225657 | A1 | 10/2006 | Mizushima |

(Continued)

FOREIGN PATENT DOCUMENTS

| | | |
|---|---|---|
| EP | 0595054 A1 | 4/1994 |
| JP | 2001349723 A | 12/2001 |

*Primary Examiner* — Sang H Nguyen
(74) *Attorney, Agent, or Firm* — Haynes and Boone, LLP (57) ABSTRACT

Methods are described that include providing a laser-based measurement tool. An implement of a semiconductor fabrication process tool (e.g., susceptor) is delivered to the laser-based measurement tool where a plurality of measurements is performed of a surface of the implement using a blue wavelength radiation. The measurements are of a distance (e.g., angstroms) from a reference plane and provide an indication of the profile of the surface of the susceptor. As the surface profile of the susceptor can affect layers deposited on target substrates using the susceptor, the measurements provide for a disposition of the susceptor.

19 Claims, 8 Drawing Sheets

(56) References Cited

U.S. PATENT DOCUMENTS

| | | |
|---|---|---|
| 2007/0207708 A1 | 9/2007 | Kiku et al. |
| 2009/0056627 A1 | 3/2009 | Shuto et al. |
| 2010/0124610 A1 | 5/2010 | Aikawa et al. |
| 2011/0120366 A1 | 5/2011 | Higashi et al. |
| 2012/0075460 A1 | 3/2012 | Aikawa et al. |
| 2012/0270407 A1 | 10/2012 | Werner et al. |
| 2014/0319784 A1 | 10/2014 | Choi et al. |
| 2015/0168304 A1 | 6/2015 | Wouters et al. |
| 2015/0221824 A1* | 8/2015 | Hatta ................ H01L 21/02521 257/98 |
| 2015/0276388 A1 | 10/2015 | Akita et al. |
| 2016/0351426 A1* | 12/2016 | Kwon ............... H01L 21/67259 |
| 2018/0173119 A1* | 6/2018 | Meissl .................. G03F 9/7042 |
| 2018/0226535 A1* | 8/2018 | Hawryluk ............. H01S 5/3013 |

* cited by examiner

METHOD FOR MEASUREMENT OF SEMICONDUCTOR DEVICE FABRICATION TOOL IMPLEMENT

PRIORITY

The present application is a divisional application of U.S. patent application Ser. No. 15/224,191, filed Jul. 29, 2016, entitled "System and Method for Measurement of Semiconductor Device Fabrication Tool Implement," the entire disclosure is incorporated herein by reference.

BACKGROUND

The semiconductor integrated circuit (IC) industry has experienced rapid growth. Technological advances in IC materials, design, and fabrication tools have produced generations of ICs where each generation has smaller and more complex circuits than the previous generation. In the course of these advances, fabrication methods have strained to realize the desire for smaller feature sizes. The developed fabrication methods give rise to challenges however.

Fabrication methods to form thin film materials include techniques of chemical vapor deposition, atomic layer deposition, physical vapor deposition, epitaxial deposition, and the like. These techniques are typically accomplished by apparatuses having reaction chambers that contain a wafer support, e.g., a susceptor, upon which a semiconductor substrate is disposed. The susceptor can be a disc upon which the target substrate is positioned for the deposition process. Typically the susceptor rotates in order for the thin film to be deposited with greater uniformity onto the target substrate(s). However, one challenge in meeting fabrication goals is the formation of uniform, quality thin films on semiconductor substrates using these deposition apparatuses.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
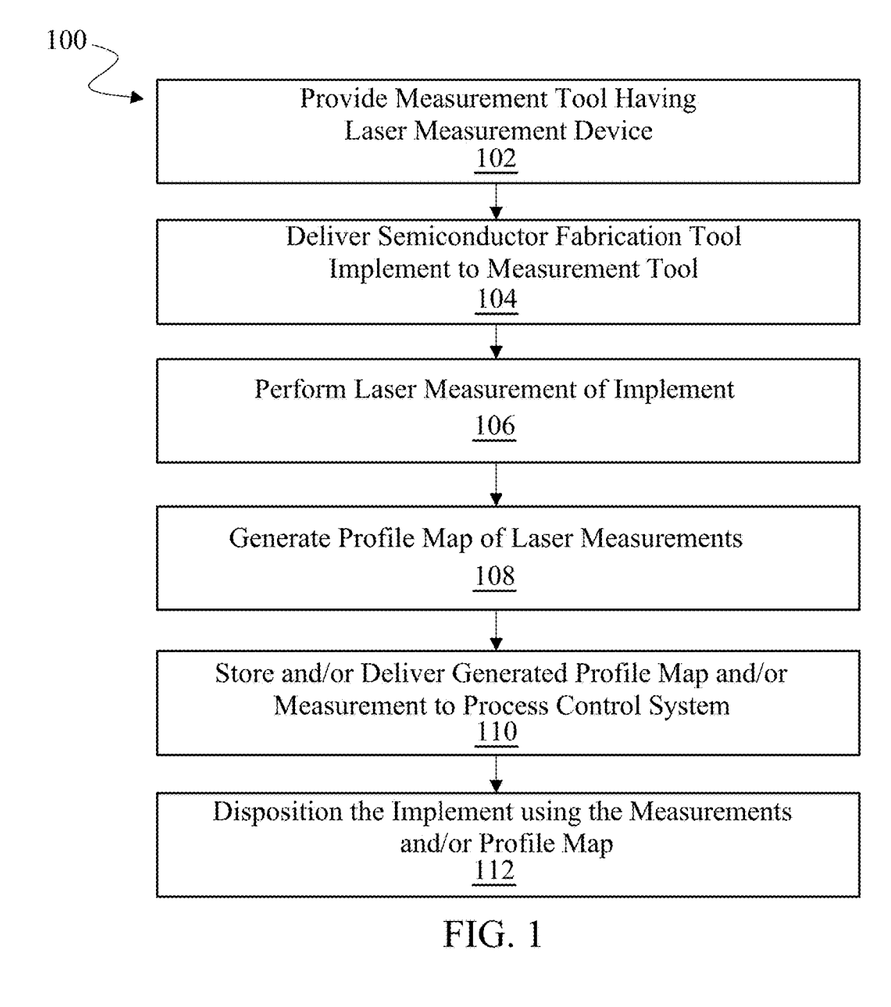
FIG. 1 is a flow chart of an embodiment of a method of measurement of a semiconductor device fabrication tool implement in accordance with some embodiments.

Referring to FIG. 1, provided is an embodiment of a method 100 of measurement of an implement of a semiconductor device fabrication tool. In an embodiment, the method 100 may be performed during a semiconductor device fabrication process.

For example, in an embodiment, the method 100 is performed as part of a maintenance program, such as a preventative maintenance (PM) program implemented in a semiconductor device fabrication process. In an embodiment, the PM program including the method 100 is directed to obtaining metrology data on an implement of a semiconductor tool. The metrology data obtained using the method 100 may determine the suitability of the semiconductor device fabrication tool and/or the implement of the semiconductor device fabrication tool for use in fabricating semiconductor devices. The method 100 may be performed at a scheduled interval such as, daily, weekly, or on a per given number of processing material lots basis.

In an embodiment, the method 100 is performed after an alert indicated by a process control system. For example, a process control system/method used in the fabrication of semiconductor devices may determine an as-deposited layer on a target substrate (e.g., semiconductor wafer) is outside of desired quality attribute (e.g., thickness uniformity is out of specification). In an embodiment, it is determined that the as-deposited layer was deposited using a first implement of a first semiconductor device fabrication tool. Upon the determination of the reduction in desired quality of the deposited layer on the substrate, the method 100 may be performed on the first implement.

In an embodiment, the method 100 may be performed as part of a qualification testing on a semiconductor device fabrication tool and/or implement of the tool. For example, the method 100 may be performed to provide measurements of an implement prior to its use in production of semiconductor devices.

The method 100 may be performed on various types of implements (e.g., pieces of equipment, devices, or instruments) of various semiconductor device fabrication tools used in the fabrication of semiconductor devices such as integrated circuits, discrete devices, light emitting diodes, and/or other components. In an embodiment, the method 100 is used to collect metrology data on an implement of a semiconductor device fabrication tool, where the semiconductor device fabrication tool is a deposition tool. The deposition tool may be suitable for depositing a thin film or layer onto a target substrate, such as a semiconductor wafer. The implement of the deposition tool may be a portion of the deposition tool suitable to hold a target substrate for the deposition process. For example, in an embodiment, the method 100 is used to collect metrology data on an implement of a wafer handling device operable to hold and/or move a target substrate, such as a semiconductor wafer. In a further embodiment, the method 100 is used to collect metrology data on a wafer holding/handling device such as a susceptor (also referred to as a platen or a chuck) of a semiconductor device fabrication tool (e.g., deposition tool) as discussed in further detail below. As discussed above, the method 100 may be used to determine the suitability of the tool and/or suitability of the implement for use during the production of semiconductor devices.

In an embodiment, the implement may be a susceptor or chuck operable to hold a target substrate during a fabrication step in forming a semiconductor device. For example, the implement may be a susceptor of a chemical vapor deposition (CVD) tool, a susceptor of a physical vapor deposition (PVD) tool, a susceptor of an epitaxial (EPI) growth tool, and/or susceptor of other suitable semiconductor device fabrication tool. In other embodiments, the susceptor may be positioned in a semiconductor device fabrication tool suitable for ion implantation, etching, or other processes. In an embodiment, the implement may be a wafer handling apparatus such as a chuck used for wafer transport, and/or other device upon which a substrate such as a semiconductor wafer or plurality of semiconductor wafers may be disposed for processing and/or transport to processing conditions. The target substrate may be affixed to the susceptor or chuck via vacuum, electrostatic forces, mechanical devices, and/or gravitational forces. The chuck or susceptor may include thermal capabilities for cooling and/or heating the substrate disposed thereon. In an embodiment, the target substrate may be a semiconductor wafer (e.g., silicon wafer, silicon germanium or other III-V material wafer, and/or other suitable semiconductor materials) having a diameter of between 6 inches and 12 inches; however, other diameters are also possible.

Turning to the steps of implementing the method 100, at block 102 a measurement tool having a laser-based measurement device is provided. In an embodiment, the measurement tool includes a laser-based measurement device, a chuck operable to hold an implement for which metrology data is desired, and suitable mechanical devices (e.g., arms) for traversing the laser over the implement. In an embodiment, the chuck of the measurement tool is operable to hold an implement such as a susceptor of a semiconductor device fabrication processing tool, such as a CVD, EPI, PVD, or other processing tool. The chuck of the measurement tool is operable to hold the implement such that a surface is exposed for receiving a beam generated by the laser-based measurement device. In an embodiment, the chuck is operable to hold a susceptor such that a surface of the susceptor that is designed to interface (e.g., physically touch) with a semiconductor substrate (e.g., wafer or wafers) during fabrication of a device on the semiconductor substrate is exposed for receiving a beam generated by the laser-beam measurement device.

An embodiment of the laser-based measurement device is described in further detail below including with reference to FIGS. 4 and 5. The laser-based measurement device may also be referred to as a sensor-based measurement device as the laser is implemented in a 3D sensor for providing a profile of a surface.

The sensor-based measurement device of the measurement tool may include a laser transmitting portion (e.g., source) and a laser receiving portion (e.g., sensor). The laser transmitting portion may include suitable circuitry (e.g., driver and/or diode circuitry) operable to generate a beam of a given wavelength. In a further embodiment, the sensor-based measurement device includes a blue-wavelength source operable to generate a radiation beam having blue-light wavelength. The laser receiving portion may further include a receptor or receiver operable to determine a reflectivity of a radiation beam (e.g., blue-wavelength beam) after the beam is incident a target surface and reflected back to the laser receiving portion. The laser receiving portion includes suitable circuitry (e.g., photo diodes, filters, amplifiers, A/D converters, signal-processing circuitry) for receiving the beam reflected by the target surface (e.g., exposed surface of the implement) and converting the received signals into electronic signals.

Figures 4A, 4B:
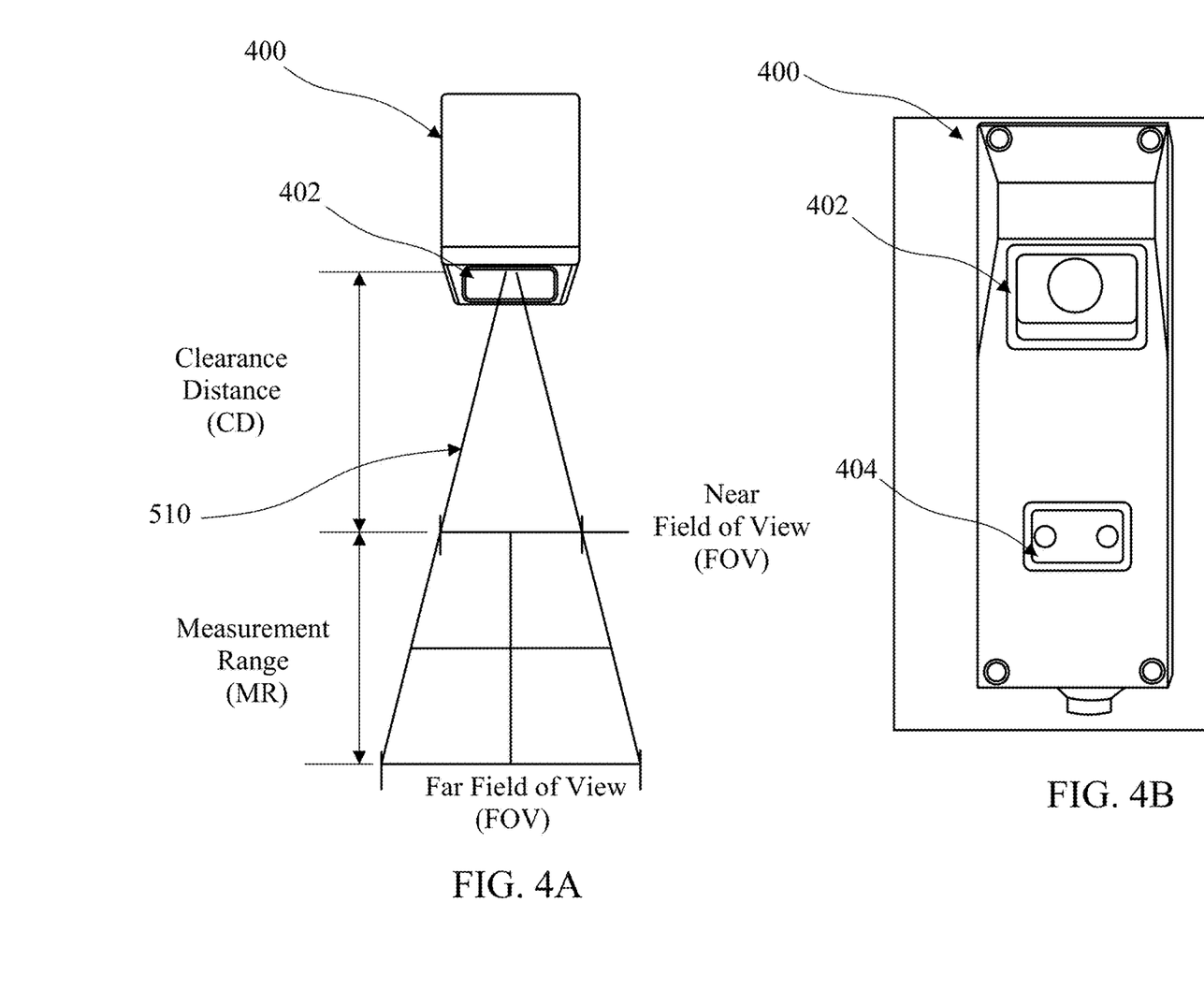
FIGS. 4A and 4B are diagrammatic views of a sensor-based measurement tool in accordance with some embodiments.

FIG. 4A/4B illustrates an embodiment of a sensor-based measurement device 400 having a laser transmitting portion including a laser output point 402 and a laser receiving portion including a laser receiving point 404. In an embodiment, the sensor-based measurement device 400 has dimensions in the 10s to 100 order of millimeters (e.g., approximately 35 mm×120 mm×149.5 mm). The sensor 400 may have a megapixel imager with an approximately 1280 points/profile resolution. The field of view may be approximately 18 to 26 mm; or in some embodiments up to approximately 1260 mm. In an embodiment, the sensor device 400 has a measurement range (MR) of approximately 25 mm to approximately 800 mm. In an embodiment, the repeatability Z is approximately 0.4 microns up to 12 microns. In an embodiment, the resolution (Z) is between approximately 0.0018 mm and 0.0030 mm. In other embodiments however the resolution may be approximately 0.092 to 0.488 mm. The clearance distance may be between approximately 40 mm and approximately 350 mm.

In an embodiment, the sensor device 400 is a GOCATOR 2300 series model such as, the 2320 model, by LMI Technologies of Vancouver, British Columbia.

The measurement tool is operable to move the target implement and/or the generated beam (e.g., laser transmitting portion) such that radiation beam(s) can be incident on all regions of the implement. In an embodiment, the measurement tool having the sensor-based measurement device includes the laser source on a moveable robotic arm that travels the laser beam (and receiver) above each region of the implement (e.g., laterally along an x-axis and perpendicular y-axis). In some embodiments, the measurement tool having the sensor-based measurement device includes the laser source on a moveable robotic arm that can alternatively or additionally move the beam source towards or away from the target implement (e.g., z-axis). In an embodiment, the chuck operable, alternatively or additionally, to hold the implement is moveable traversing the implement below a laser beam (e.g., stationary beam).

Figure 5:
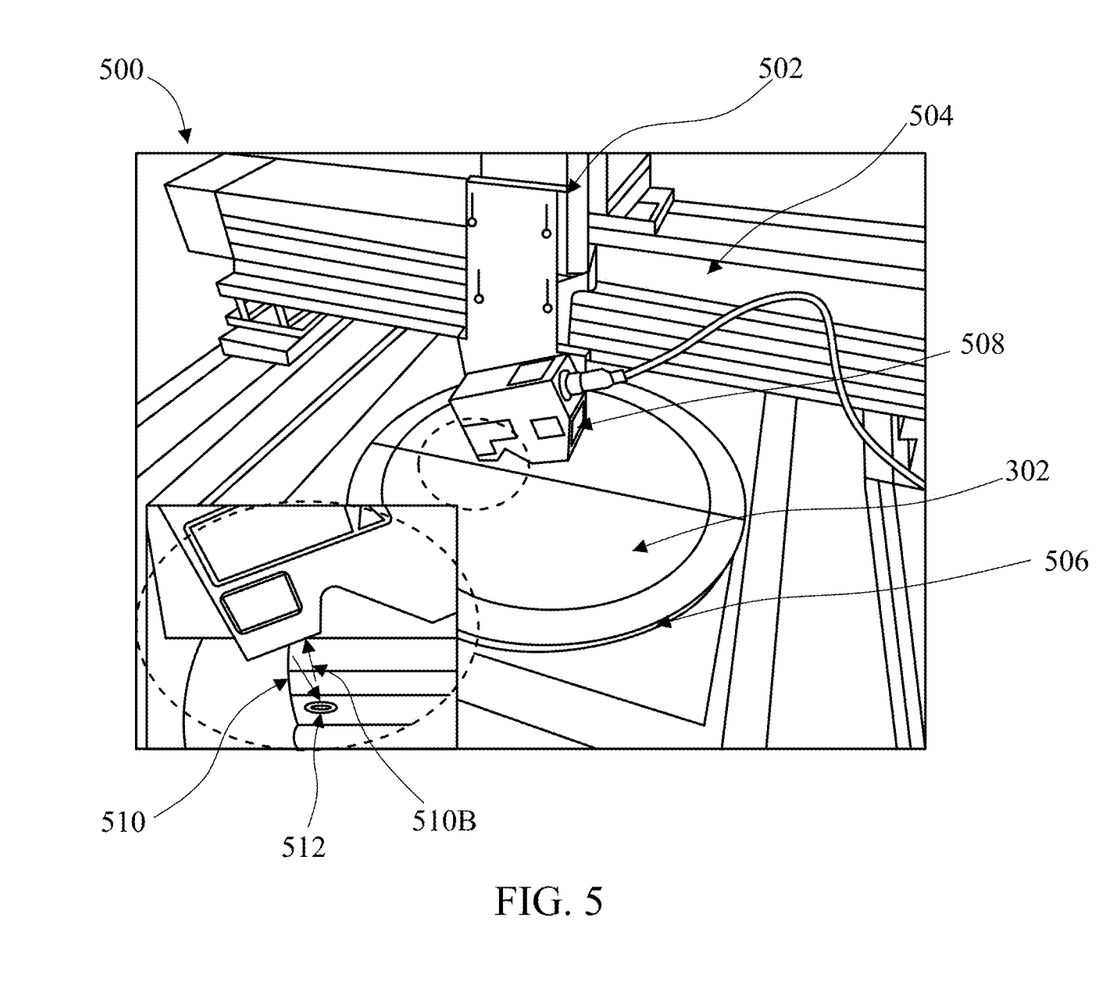
FIG. 5 is a diagrammatic perspective view of an embodiment of a measurement apparatus in accordance with some embodiments.

FIG. 5 illustrates an embodiment of a measurement tool 500. The measurement tool 500 includes a first arm 502 and a second arm 504, a chuck 506, and a laser (or sensor) device 508. The first arm 502 and/or the second arm 504 suspend and/or move the sensor device 508. In an embodiment, the first arm 502 and/or the second arm 504 are programmable such that they movement is operable to position the sensor device 508 over each portion of an implement disposed in the chuck 506. The first arm 502 and/or the second arm 504 may move the sensor device 508 in along an x-axis, y-axis, and/or z-axis as discussed above. FIG. 5 illustrates an implement 302 disposed on the chuck 506. In an embodiment, the implement 302 is a susceptor substantially similar to as discussed with reference to FIG. 3.

In an embodiment, the measurement tool 500 is operable to move the implement in an x-direction, y-direction, and/or z-direction. In an embodiment, the x-direction has a moving path of between 0 and approximately 600 mm, the y-direction moving path is between 0 and approximately 600 mm, and the z-direction moving path is between 0 and approximately 100 mm.

The sensor device 508 includes a laser transmitting portion and a laser receiving portion substantially similar to as discussed above. In an embodiment, the sensor device 508 is substantially similar to the laser-based measurement tool 400, discussed above with reference to FIG. 4A, 4B. A laser beam 510 is generated from the laser transmitting portion (see also FIG. 4A). The laser beam 510 is incident an exposed surface of the implement 302. The laser beam 510 is reflected back (illustrated as 510B) to the laser receiving portion of the laser device 508, where it is used to determine a distance of a spot 512 on the implement 502. In an embodiment, the distance of the spot 512 is determined relative to a reference plane.

In an embodiment, the laser beam 510 is electromagnetic radiation with a wavelength between 360 and 480 nanometers (e.g., "blue" wavelength). The beam 510 is also illustrated in FIGS. 4A/4B.

The method 100 then proceeds to block 104 where an implement (e.g., device or instrument) of a semiconductor device fabrication tool is delivered to the measurement tool. An embodiment of the semiconductor device fabrication tool and associated implement(s) is described in further detail with reference to FIG. 3. In an embodiment, a susceptor (e.g., wafer positioning device) is the implement delivered to the laser-based measurement tool in block 104. The susceptor may be an implement of a semiconductor device fabrication tool such as a CVD, PVD, EPI and/or other suitable deposition tool. In other embodiments, other implements of semiconductor tools, including but not limited to deposition tools, etch tools, or ion implantation tools, may be delivered in block 104 of the method 100. In an embodiment, the susceptor is delivered to the measurement tool and disposed onto the chuck or implement-holding device of the measurement tool. The susceptor, or other implement, may be positioned such that an exposed surface faces a portion of the laser-transmitting portion from which the beam will be emitted. In an embodiment, the exposed surface of the susceptor, or other implement, is that surface which interfaces with a semiconductor substrate (e.g., wafer) during one or more fabrication steps in forming semiconductor devices (e.g., deposition of films) on the semiconductor substrate. In other words, the exposed surface is that upon which a target substrate is placed.

Figure 3:
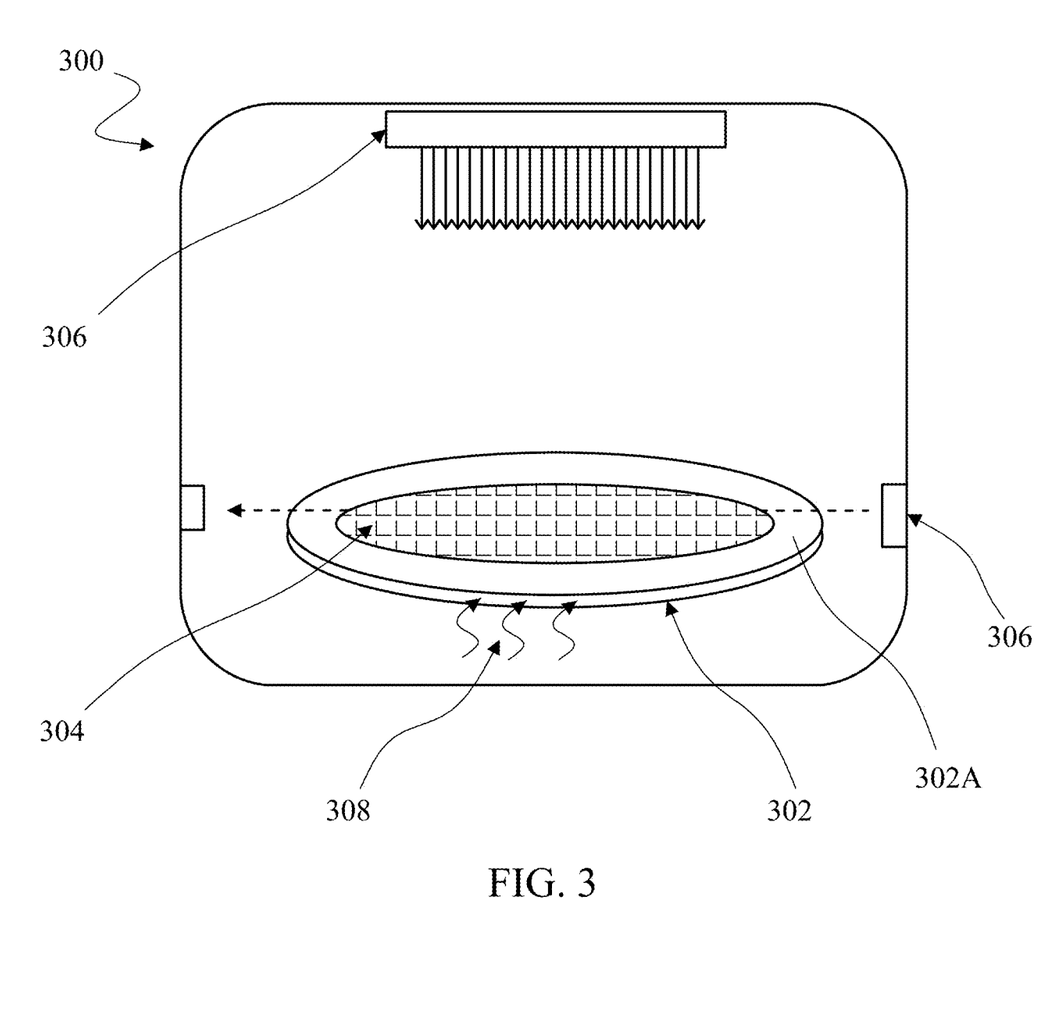
FIG. 3 is a diagrammatic view of an embodiment of a semiconductor device fabrication tool in accordance with some embodiments.

FIG. 3 illustrates an embodiment of a semiconductor device fabrication tool 300. (It is noted that FIG. 3 is a simplified schematic drawing.) In an embodiment, the semiconductor device fabrication tool 300 is one of various types of a chemical vapor deposition (CVD) tools, a physical vapor deposition (PVD) tool, and/or an epitaxial (EPI) growth tool. The tool 300 includes one or more inlets 306 (e.g., shower head or laminar flow inlet) providing for a processing gas such as, deposition species, precursors, purge gases, inert components, or other materials used to form a layer on a target semiconductor substrate 304. The semiconductor substrate 304 is disposed on an implement 302, also referred to as a susceptor or wafer chuck.

The implement 302 may be a susceptor that is disc without or with one or more coatings formed thereon. In an embodiment, the implement 302 is a susceptor of a graphite disc, a SiC disk, or a graphite disc with a SiC coating upon which the target substrate is positioned for the deposition process. The implement 302 may be a susceptor having a diameter of between approximately 1 mm to approximately 500 mm. In an embodiment, the implement 302 is a susceptor that holds a single target substrate (e.g., single semiconductor wafer). In an embodiment, the implement 302 is a susceptor that holds a plurality of target substrates (e.g., wafers), such as suitable for tools where multi-susceptors are used in a single chamber (e.g., MOCVD). The implement 302 has a top surface 302A upon which the target wafer 304 is disposed. In an embodiment, the top surface 302A is a coating such as SiC coating. In an embodiment, the top surface 302A is graphite. A temperature control element may provide heating and/or cooling 308 to the implement 302.

Figure 8:
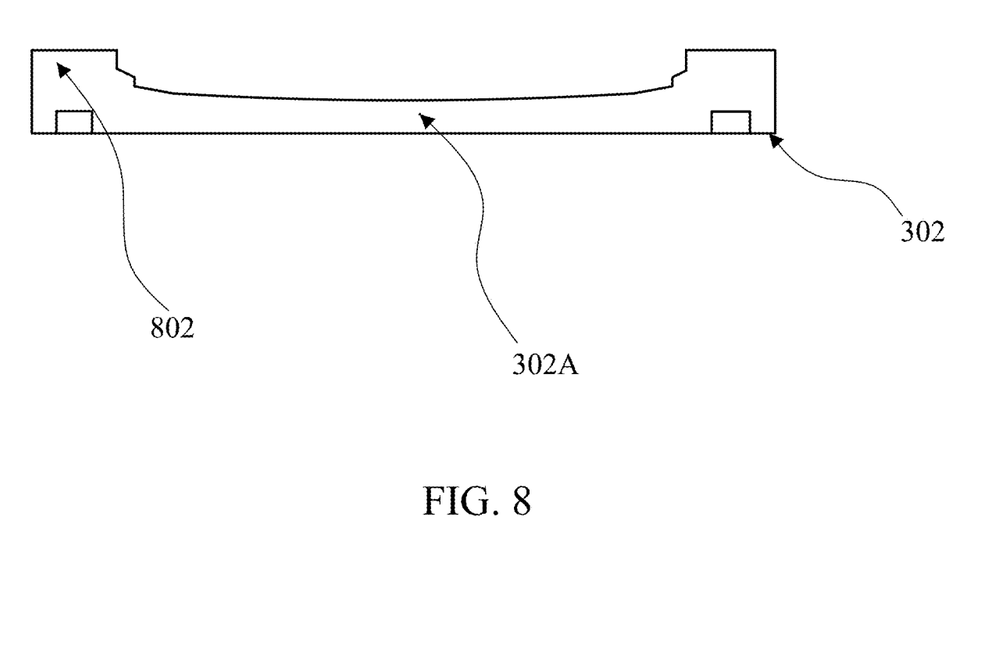
FIG. 8 is a cross-sectional view of an implement of a semiconductor device fabrication tool in accordance with some embodiments.

An exemplary cross-section of an implement such as the implement 302 is illustrated in FIG. 8. FIG. 8 illustrates a flat edge region 802 and a top surface 302A that is operable to hold a wafer. The flat edge region 802 may include similar coatings that the center-region of the susceptor.

After providing the implement to the measurement tool, the method 100 then proceeds to block 106 where a measurement is performed on the implement by the sensor-based measurement device. The measurement may be performed by delivering a laser beam from the laser-based measurement tool, for example, from the laser transmitting portion of the laser device, such that the beam is incident a spot on a target surface of the implement, described above with reference to block 104. The incident beam may then be reflected from the spot on the incident surface of the implement back to the laser-based measurement tool and in particular to the laser receiving portion of the laser device. The reflectivity of the beam may be used to determine a distance of the spot on the incident surface. In an embodiment, the radiation beam has a spot size of approximately 18 mm to approximately 26 mm. In an embodiment, the reflectivity of the beam is used to determine a distance the surface of the implement at the measurement spot is displaced from a reference plane (e.g., above (−) or below (+) a reference plane). In an embodiment, the distance of displacement is determined in angstroms. In an embodiment, the measurement resolution of the laser-based measurement is approximately 10 microns (μm) or less.

Any number of "spots" on the implement may be measured; in other words, a beam may be incident the surface of the implement at any number of locations during block 106 for which measurement is taken. In an embodiment, over 100,000 data points are measured. In an embodiment, approximately 300,000 measurement data points are generated in block 106 of the method 100. Thus, in an example a radiation beam is incident 300,000 places ("spots") on the implement and 300,000 data points of a distance of displacement from a reference plane are measured and/or stored. Again, any number of data points are possible and within the scope of the disclosure. The number of data points may be determined based on an analysis of computing time, measurement time, and accuracy requirements.

In an embodiment, a reference plane is determined as a distance to a planar surface of the implement. In an embodiment, a reference plane is determined by measuring a plurality (e.g., 3) of points on an edge region of the tool implement (e.g., susceptor). The measurement data may provide displacement in angstroms from a reference plane. For example, a bump of the implement may provide for a measurement of an 'x' angstrom distance above a reference plane. As another example, a pit (concave surface profile) of the implement may provide for a measurement of 'y' angstroms below a reference plane. In some embodiment, the reference plane is set at a known planar surface of the implement. In other embodiments the reference plane is set at a different point and the measurements similarly achieve a measurement of the surface profile of the implement by comparison with the reference plane.

The measurement data point or points described above as generated by the sensor-based measurement tool may be used to determine a profile of a surface or portion of the surface of the target implement using the reflected radiation beam. The profile of the surface may include a deviation in height of a particular point on the surface, and/or a deviation in planarity of the surface at a particular point.

Figure 6A:
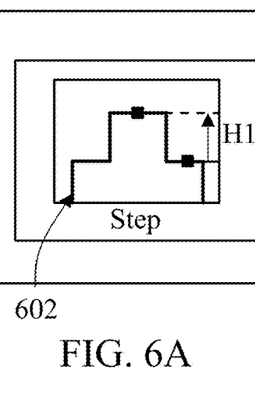
FIGS. 6A, 6B, 6C, 6D, and 6E are illustrations of aspects of an implement that may be perceived by a measurement apparatus in accordance with some embodiments.
Figure 6B:
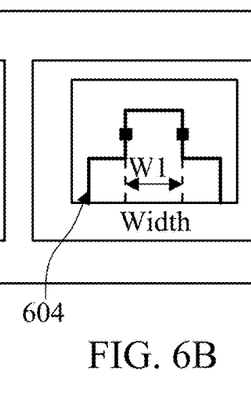
Figure 6C:
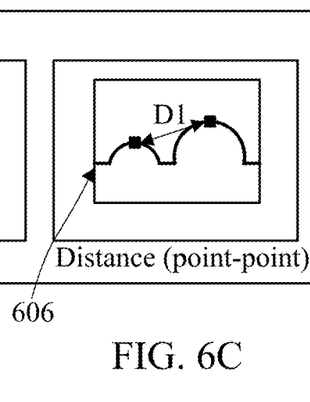
Figure 6D:
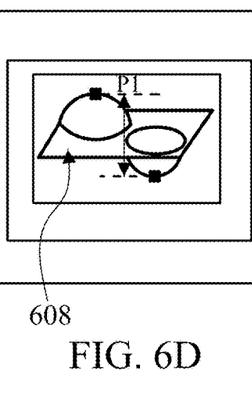
Figure 6E:
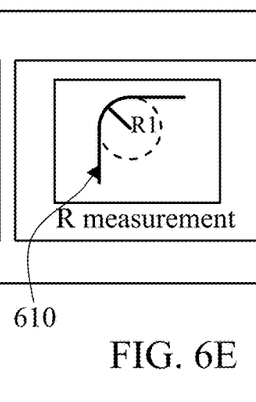

Exemplary aspects of a profile of the target surface of the implement that may be identified by the measurements of block 106 on a surface of an implement are illustrated in FIGS. 6A, 6B, 6C, 6D and 6E. Each of the surface profiles of FIGS. 6A, 6B, 6C, 6D and 6E may be disposed on a single implement, or one or more of the surface profiles may not found on a given implement. FIG. 6A illustrates a surface profile 602 including a step having a height H1. In an embodiment, the measurement of block 106 determines H1 (e.g., by reflection of a beam from the surface). H1 may be determined in a number of angstroms. FIG. 6B illustrates a surface profile 604 including a step or bump having a width W1. In an embodiment, the measurement of block 106 determines W1 (e.g., by reflection of a beam from the surface). W1 may be determined in a number of angstroms. FIG. 6C illustrates a surface profile 606 including a plurality of steps or bumps having distance D1 therebetween. In an embodiment, the measurement of block 106 determines D1 (e.g., by reflection of a beam from the surface). D1 may be determined in a number of angstroms. FIG. 6D illustrates a surface profile 606 including a plurality of steps or bumps having a peak-to-peak distance of P1. In an embodiment, the measurement of block 106 determines P1 (e.g., by reflection of a beam from the surface). P1 may be determined in a number of angstroms. FIG. 6E illustrates a surface profile 610 including a curvature having a radial measurement R1. In an embodiment, the measurement of block 106 determines R1 (e.g., by reflection of a beam from the surface). R1 may be determined in a number of angstroms. These surface profiles are exemplary only and not intended to be limiting beyond what is specifically recited in the claims that follow.

The method 100 then proceeds to block 108 where the measurements or metrology data obtained in block 106 is presented in a desired format. In an embodiment, the metrology data is compared to a statistical process control limit to determine the acceptability of the implement for use in fabrication processes. In an embodiment, the metrology data is used in a model generated to determine effects of the topography of the implement on the fabrication of semiconductor devices. For example, the metrology data of the implement (e.g., susceptor) may be used with a suitable model to determine a thickness variation of a thin film deposited on a target wafer using the implement. In an embodiment, the model is generated using experimental data.

Figure 7:
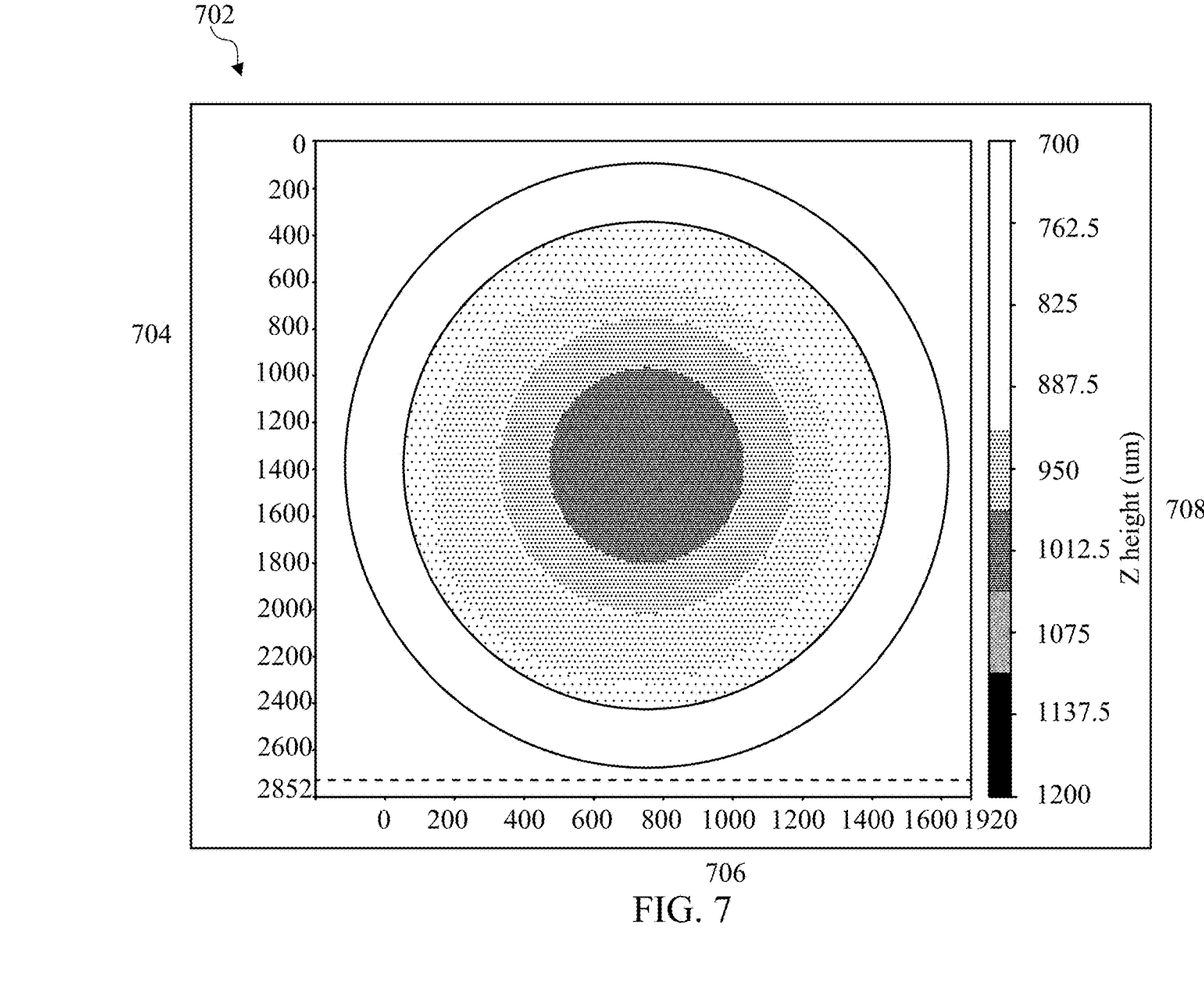
FIG. 7 is a representation of a profile map associated with measurement of an implement of a semiconductor device fabrication tool in accordance with some embodiments.

In an embodiment, block 108 includes generating a profile map using the metrology data associated with a corresponding position on the implement subjected to the measurement. The profile map may include an entirety of a surface of the implement or a portion thereof. An exemplary embodiment of a profile map generated from metrology data is illustrated in FIG. 7. While a profile map 702 illustrated in FIG. 7 is representative of an entirety of an implement that is a single-wafer susceptor, other embodiments are possible. The profile map 702 includes a value of distance (e.g., angstroms), determined from the reflected laser beam, at a given point. Any number of points across the implement may be used to generate map 702. In an embodiment, 100,000 or greater number of measurement points are used to generate the profile map 702.

The profile map 702 includes a first axis 704 that is a relative position on a first direction of the implement (e.g., having a reference of "0" at a first edge of the susceptor). The map 702 includes a corresponding axis 706 that is a relative position on a second direction of the implement (e.g., having a reference of "0" at a second edge of the susceptor). The first and second directions (axis 704 and 706) may be perpendicular and coplanar. A third axis 708 illustrates the measurement distance (in a z-direction perpendicular to the first and second distances) to a surface of the measured implement. The third axis 708 may be measured in angstroms and represented by suitable shading (as illustrated in map 702). The third axis 708 may be a distance relative to a reference plain.

In an embodiment, third axis 708 is illustrated in profile map 702 as color coded for ease of reference. For example, a greater distance (angstroms) from the reference plane may provide for the location of the measurement point to be colored a first color on the profile map 702, a medium distance (angstroms) from the reference plane may provide for the location of the measurement point to be colored a second color on the profile map 702, a lower distance (angstroms) from the reference plane may provide for the location of the measurement point to be colored a third color on the profile map 702. In an embodiment, areas immediately surrounding the measurement point are similarly colored to provide a representation of the complete surface of the implement.

The profile map 702 illustrates a center-edge affect to the surface profile of the implement. In other words, an edge region includes a greater displacement from a reference plane and a center region. This is exemplary only and not intended to be a limiting surface profile beyond what is specifically claimed.

In an embodiment, the method 100 proceeds to block 110 where the metrology data, for example, the generated profile map, is delivered to a process control system. Block 112 then uses the profile map and/or the measurement data of block 106 to disposition the implement. In an embodiment, the process control system operates to determine whether the implement is to be returned to use in fabricating semiconductor devices or whether the implement requires rework, remediation, and/or replacement prior to use in further fabrication steps. In an embodiment, the process control system dispositions the semiconductor device fabrication tool such that it is not used for fabrication processes. In an embodiment, the process control system dispositions material previously processed using the implement such that the previously processed material is reworked, reconditioned, remedied, or scrapped based on a predicted lack of quality for an as-deposited layer (e.g., layer deposited by the implement). In an embodiment, blocks 110 and 112 include delivering the generated profile map to a process control system and/or engineer that or who provides the appropriate dispositions as discussed above. In an embodiment, the disposition of block 112 is part of a preventative maintenance (PM) plan implemented on the semiconductor device fabrication tool and/or implement itself that includes providing the appropriate dispositions discussed above.

The method 100 may continue to provide other steps of in the semiconductor fabrication process including, for example, returning the susceptor to the semiconductor device fabrication tool for use in a semiconductor device fabrication step (e.g., deposition of a layer). In some embodiments, the method 100 proceeds to reworking and/or replacement of the measured implement before returning the implement to a fabrication tool for performance of another process step.

Figure 2:
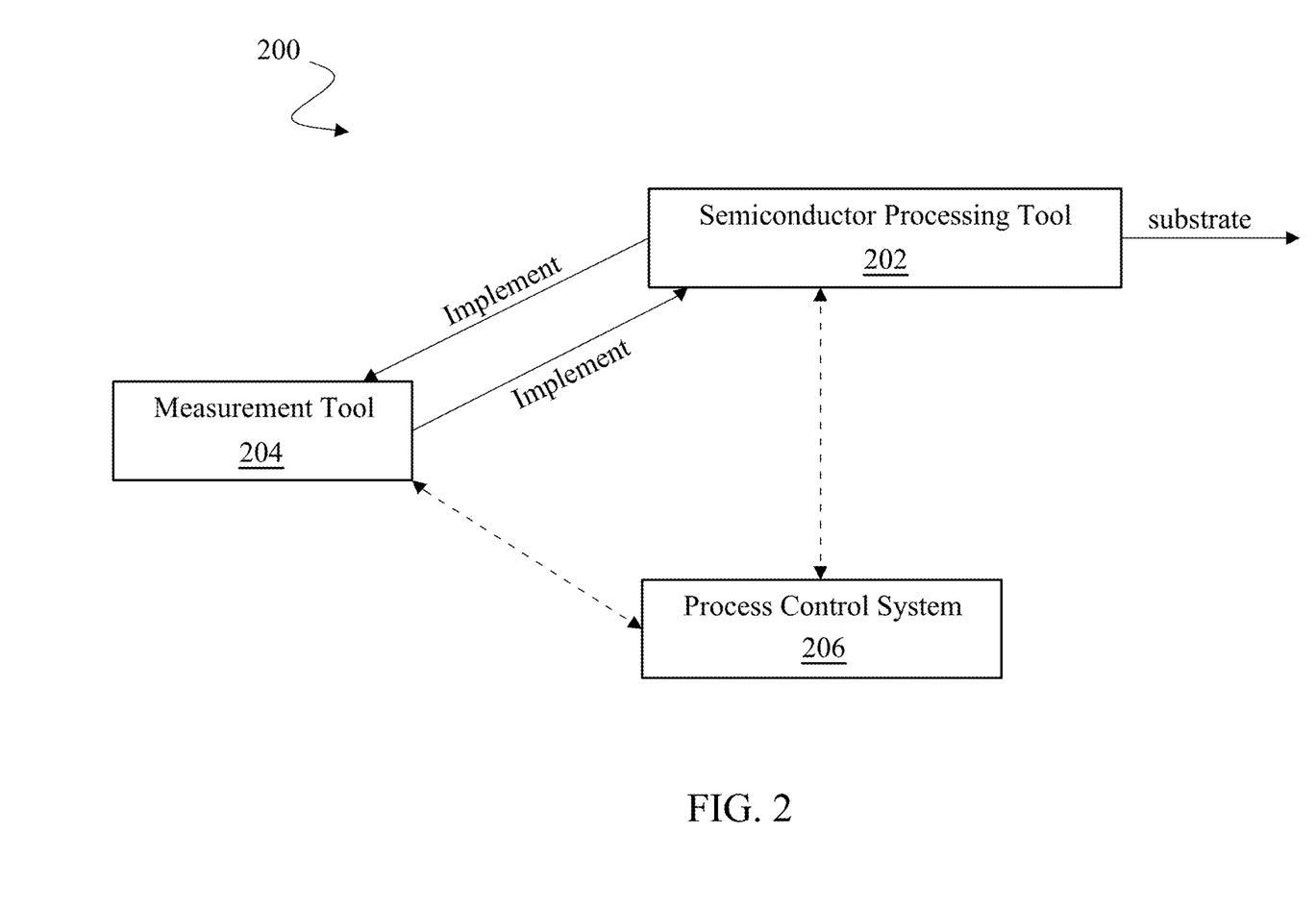
FIG. 2 is a block diagram of a system including a semiconductor device fabrication tool implement measurement device in accordance with some embodiments.

Referring now to FIG. 2, illustrated is a system 200 operable to accomplish one or more steps discussed above with reference to FIG. 1 and the method 100. The system 200 includes a semiconductor device fabrication tool 202, a measurement tool 204, and a process control system 206. The system 200 illustrates material flow as solid lines; information flow is illustrated in dashed-lines. An implement is delivered from the semiconductor device fabrication tool 202 to the measurement tool 204. In an embodiment, the implement is returned from the measurement tool 204 to the semiconductor device fabrication tool 202. A target substrate, e.g., semiconductor wafer, is provided in the semiconductor device fabrication tool 202 for one or more processing steps, after which the substrate is delivered to a subsequent processing step, for example, another semiconductor processing tool.

In an embodiment, the semiconductor device fabrication tool 202 is a CVD, EPI, PVD, ion implanter, etcher, or other processing tool. Exemplary tools include, but are not limited to, Centura® line of tools or Endura® line of tools by Applied Materials® Inc., Santa Clara, Calif., deposition tools by Novellus Systems, Inc, of San Jose, Calif. The semiconductor device fabrication tool 202 includes a plurality of implements (or devices) used during the fabrication processes performed by the tool 202. Examples of these implements are those which hold and/or transport a target substrate before, during or after the fabrication processes such as, a susceptor. The quality of the susceptor may be important to ensuring a quality of fabrication process performed by the tool 202. For example, the planarity of a surface of a susceptor used by the tool 202 may affect the planarity of an as-deposited layer on a substrate that is performed by the tool 202. One example of the semiconductor device fabrication tool 202 is described above with reference to FIG. 3.

In an embodiment, the measurement tool 204 is a sensor (e.g., laser generating)-based measurement tool. The measurement tool 204 may be substantially similar to as discussed above with reference to block 102 of the method 100 and/or the measurement tool of FIGS. 4 and 5. For example, the measurement tool includes a sensor-based measurement device and a chuck operable to hold an implement for which metrology data is desired. In an embodiment, the chuck is operable to hold a susceptor of a semiconductor device fabrication tool 202. The chuck of the measurement tool is operable to hold the implement such that a surface is exposed for receiving a beam generated by the sensor-based measurement device of the measurement tool 204. In an embodiment, the chuck is operable to hold a susceptor such that a surface of the susceptor which is designed to interface with a semiconductor substrate (e.g., wafer or wafers) during fabrication of a device on the semiconductor substrate is exposed for receiving a beam.

The sensor-based measurement device of the measurement tool 204 may include a laser transmitting portion (e.g., source) and a laser receiving portion (e.g., sensor) including as discussed above. The measurement tool 204 is operable to move the implement and/or the generated laser (laser transmitting portion) such that laser beams can be incident on all regions of the implement. In an embodiment, the sensor-based measurement device includes the laser source on a moveable robotic arm that traverses the laser beam (and receiver) above each region of the implement. In an embodiment, the chuck operable to hold the implement is moveable traversing the implement below a laser beam (e.g., stationary beam). The laser beam is incident on the implement (e.g. susceptor) and reflected back to a laser receiving portion of the measurement device 204. The reflection of the beam determine a distances of the incident spot on the implement of the semiconductor processing tool 202. In an embodiment, the distance is determined relative to a reference plane. In an embodiment, the measurement tool 204 generates electromagnetic radiation with a wavelength between 360 and 480 nanometers (e.g., "blue" wavelength) in order to perform the measurement of the surface of the implement of the semiconductor device fabrication tool 202.

In an embodiment, a process control system 206 is an information handling system such as a computer, server, workstation, or other suitable device. The process control system 206 may include a processor that is communicatively coupled to a system memory, a mass storage device, a communication module, a display module, and/or other suitable devices. The system memory can provide the processor with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device. These programs may be suitable for performing one or more steps of the method 100. These programs may also be suitable for generating a profile map. In some embodiments, these programs include instructions that compare a measurement performed by the method 100 with a statistical process control limit. Examples of mass storage devices may include hard discs, optical disks, magneto-optical discs, solid-state storage devices, and/or a variety other mass storage devices known in the art. A communication module is operable to communicate information with the other components in the system (e.g., through a network or directly with a communication module of other components). For example, the process control system 206 may communicate data with the measurement device 204 and/or the semiconductor device fabrication tool 202. The communication module is also operable to communicate information such as process parameters with the semiconductor device fabrication tool 202. A The communication module of the process control system 206 may also be operable to receive user input such as dispositions of material or tool status based on measurement data provided by the measurement tool 204. In an embodiment, an information handling system in the measurement device 204 or the process control system 206 includes software instructions for performing the operations discussed with reference to FIGS. 1 and 7.

While described herein in some embodiments as the measurement tool and the semiconductor device fabrication tool being separate tools, for example, having separate chambers, in other embodiments, the measurement tool may be embedded within the semiconductor device fabrication tool (e.g., within the chamber of the deposition tool, such as the CVD, PVD, or EPI tool).

Thus, provided herein are systems and methods that deliver precise, efficient, and reliable measurements of an implement to be used in semiconductor device fabrication processes. It is noted that the present embodiments are not limited to fabrication of semiconductor devices, but may be applied to various technologies and implements. The methods and systems can improve quality of semiconductor processing tools such as, deposition tools. For example, as technology nodes decrease greater control and precision is required for as-deposited layers (e.g., EPI, CVD, PVD layers). In order to maintain this control and precision, control of the quality of the implements used to form the layers and/or interact with the device substrates is desired. In an embodiment, some embodiments of the above system(s) and method(s) identify implements such as susceptors that will cause non-uniformity in processes if used to fabricate production devices, for example, if used in deposition processes for semiconductor wafers. Some embodiments of the system(s) and method(s) can, for example, identify planarity issues (e.g., tilt) prior to the deposition processes on control wafers, patterned wafers, production wafers, or other substrates. This can reduce costs, PM program requirements, engineering resources, material costs, and/or other aspects of improvement in the fabrication process.

Certain embodiments described herein provide for an improvement in identification of susceptor nonconformities. For example, the percentages of identification of a nonconforming susceptor can be increased in some cases to near 100%.

Some embodiments described herein advantageously provide the generation of a profile map, see the example of FIG. 7, that provides a 3D representation of an implement (e.g., susceptor). The profile map may be provided automatically by the systems provided herein. Further, the profile map may provide a profile or contour that can reflect possible failures of the implement measured and/or allow the prediction of quality of processes performed using the measured implement. For example, a contour of the profile map may allow for prediction of a thickness variation of an as-deposited layer using the implement associated with the map.

For example, in an embodiment, the measurement systems and methods above identify a pocket of a given depth on a susceptor. Experimental and/or modeling information can indicate that the pocket is likely to cause a variation in the profile of a layer if deposited using the susceptor having the pocket. In some embodiments, the profile of the layer would give a thicker profile at the region of the substrate overlying the pocket region of the susceptor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Thus, in one of the broader embodiments a method is provided that includes providing a laser-based measurement tool. An implement of a semiconductor fabrication process tool is delivered to the laser-based measurement tool. A plurality of measurements is performed of a surface of the implement using a blue wavelength radiation from the sensor-based measurement tool. In some embodiments, the measurements are of a distance (e.g., angstroms) from a reference plane. The measurements may illustrate a profile of the surface of the implement (see, e.g., FIGS. 6A, 6B, 6C, 6D, 6E). A disposition for the implement is determined based on the plurality of measurements. In some embodiments, the disposition is for the implement to be returned to the processing tool. In some embodiments, the disposition is for the implement to not be used for subsequent processing without remedy and/or rework.

In another embodiment, a method is provided that includes providing a measurement tool having a laser transmitting portion and a laser receiving portion. In some embodiments, the measurement tool is separate from a processing tool sued to fabricate semiconductor devices. The measurement tool irradiates a plurality of points on a susceptor using a radiation beam generated by the laser transmitting portion. A measurement of a distance for each of the plurality of points is stored. The distance includes a distance from a reference plane. A map is then generated using the stored measurements. An example map is provided in FIG. 7.

In one embodiment, a system is provided. The system includes a semiconductor processing tool including a susceptor used to hold a target substrate. In some embodiments, this processing tool may be a deposition tool (e.g., CVD, PVD, EPI). The system further includes a measurement device including a laser source and a chuck operable to hold the susceptor. The system further includes a process control system operable to receive data from the measurement device.

What is claimed is:

1. A method, comprising:
providing a measurement tool having a laser transmitting portion and a laser receiving portion;
providing a susceptor having a surface;
irradiating each of a plurality of points on the surface of the susceptor using a radiation beam generated by the laser transmitting portion;
obtaining a reflectivity of the radiation beam received by the laser receiving portion from the irradiating;
using the obtained reflectivity to determine a distance measurement for each of the plurality of points on the susceptor;
storing the distance measurement for each of the plurality of points, wherein the distance measurements include a distance from a reference plane;
using a process control system, generating a profile map of the surface of the susceptor using the stored distance measurements; and
using the generated profile map to determine the susceptor requires replacement.

2. The method of claim 1, wherein the radiation beam has a wavelength between 360 and 480 nanometers.

3. The method of claim 1, wherein the irradiating each of the plurality of points includes irradiating at least 100,000 points on the surface of the susceptor.

4. The method of claim 1, wherein the susceptor is a single wafer susceptor of a deposition tool operable to form a layer on a semiconductor wafer.

5. The method of claim 1, further comprising:
reworking the after determining the susceptor requires replacement.

6. The method of claim 1, wherein the generating the profile map includes:
using a color on the profile map to indicate the distance from the reference plane.

7. The method of claim 1, wherein the storing the distance measurement for each of the plurality of points includes storing a value in angstroms.

8. The method of claim 1, further comprising:
using the stored distance measurements to determine a profile of the surface of the susceptor.

9. The method of claim 8, wherein the profile includes at least one of a step height, a bump width, a peak to peak distance, a bump to bump distance, and a curvature.

10. The method of claim 1, wherein the laser transmitting portion provides a blue wavelength radiation beam.

11. The method of claim 1, wherein the profile illustrates a bump width and a bump to bump distance.

12. A method, comprising:
providing a measurement tool having a laser transmitting portion and a laser receiving portion;
providing an implement consisting of a susceptor of a semiconductor fabrication deposition tool;
irradiating each of a plurality of points on a surface of the implement using a radiation beam generated by the laser transmitting portion, wherein the irradiating includes reflecting the radiation beam off of each of the plurality of points on the surface;
collecting a measurement of a distance for each of the plurality of points on the surface of the implement, wherein the distance includes a distance from a reference plane, wherein the collecting the measurement includes obtaining a reflectivity of reflected radiation beam off of each of the plurality of points on the surface; and
generating a profile map of the implement using the collected measurements to disposition the implement; and
determining a disposition of the implement using the profile map.

13. The method of claim 12,
wherein the susceptor is operable to hold a single semiconductor wafer.

14. The method of claim 12, wherein the radiation beam has a wavelength between 360 and 480 nanometers.

15. The method of claim 12, wherein the irradiating each of the plurality of points includes irradiating at least 100,000 points on the implement.

16. The method of claim 12, wherein the generating the profile map includes:
using a color on the profile map to indicate the distance from the reference plane.

17. The method of claim 12, further comprising:
using the collected measurements to determine a profile of the surface of the implement, wherein the profile includes at least one of a bump width or a bump to bump distance.

18. The method of claim 12, wherein the determining the disposition of the implement using the profile map includes reworking the implement.

19. A method, comprising:
providing a measurement tool having a blue-wavelength laser transmitting portion and a blue-wavelength laser receiving portion;
irradiating each of a plurality of points on a surface of a susceptor using a radiation beam generated by the blue-wavelength laser transmitting portion, wherein the susceptor is a wafer support device;
using the blue-wavelength laser receiving portion to receive a respective reflected radiation beam from the irradiating of each of the plurality of points on the surface of the susceptor;
using a parameter of the respective reflective radiation beam to determine a distance measurement for each of the points on the susceptor;
storing the distance measurement for each of the plurality of points, wherein the distance measurements include a distance from a reference plane; and
generating a profile map of the susceptor using the stored distance measurements; and
using the generated profile map to disposition the susceptor.

* * * * *